United States Patent
Yeh et al.

(10) Patent No.: US 6,482,706 B1
(45) Date of Patent: Nov. 19, 2002

(54) METHOD TO SCALE DOWN DEVICE DIMENSION USING SPACER TO CONFINE BURIED DRAIN IMPLANT

(75) Inventors: Yen-hung Yeh, Taoyuan Hsien (TW); Tso-Hung Fan, Taipei Hsien (TW); Mu Yi Liu, Taichung (TW); Kwang Yang Chan, Hsinchu (TW); Tao-Cheng Lu, Kaoshiung (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 10/013,982

(22) Filed: Dec. 10, 2001

(51) Int. Cl.<sup>7</sup> ...... H01L 21/336; H01L 21/338
(52) U.S. Cl. ...... 438/301; 438/261; 438/300; 438/185
(58) Field of Search ...... 438/301, 300, 438/304, 724, 261, 305, 185, 591

(56) References Cited

U.S. PATENT DOCUMENTS

| | | | | |
|---|---|---|---|---|
| 4,855,246 A | * | 8/1989 | Codella et al. | 438/522 |
| 5,940,710 A | * | 8/1999 | Chung et al. | 438/529 |
| 6,297,096 B1 | * | 10/2001 | Boaz | 438/261 |
| 6,417,081 B1 | * | 7/2002 | Thurgate | 438/526 |
| 6,420,237 B1 | * | 7/2002 | Chang | 438/300 |
| 2002/0052081 A1 | * | 5/2002 | Eitan | 438/261 |
| 2002/0086548 A1 | * | 7/2002 | Chang | 438/724 |

* cited by examiner

Primary Examiner—John F. Niebling
Assistant Examiner—Walter Lindsay
(74) Attorney, Agent, or Firm—J.C. Patents

(57) ABSTRACT

A method of scaling down device dimension using spacer to confine the buried drain implant, applicable for forming memory device such as substrate/oxide/nitride/oxide/silicon (SONOS) stacked device or nitride read only memory (NROM) device. A patterned conductive layer is used as a mask for forming a pocket doped region. A spacer is formed on a side-wall of the conductive layer. As the implantation region is confined by the side-wall, a buried drain region formed by drain implantation is reduced. Therefore, the effective channel length is not reduced due to the diffusion of the buried drain region. It is thus advantageous to scale down device dimension.

20 Claims, 5 Drawing Sheets

METHOD TO SCALE DOWN DEVICE DIMENSION USING SPACER TO CONFINE BURIED DRAIN IMPLANT

CROSS-REFERENCE TO RELATED APPLICATION

This application claims the priority benefit of Taiwan application serial no. 90129019, filed Nov. 23, 2001.

BACKGROUND OF THE INVENTION

1. Field of the Invention

The invention relates in general to a method to scale down device dimension, and more particularly, to a method to scale down device dimension by confining a buried drain implantation.

2. Description of the Related Art

To obtain a short, small, light and thin device or application system, formation of buried structure such as buried drain becomes particularly popular in various memory devices. However, as the system or device is continuously shrunk, fabrication problems occur to reduce the product reliability. One of the fabrication problems is the short channel effect.

FIG. 1 shows a buried drain region formed by a conventional process. An oxide/nitride/oxide (ONO) stacked layer 102 and a conductive layer 104 are sequentially formed and patterned on a substrate 100. Using the patterned conductive layer 104 as a mask, an ion implantation process is performed to form a buried drain region 106 in the substrate 100. As the buried drain region 106 has a dopant concentration much higher than the substrate 100, the dopant in the buried drain region 106 diffuses outwardly to the substrate 100 to cause a reduction of the effective channel length.

In addition to the ion implantation step for forming the buried drain region, a pocket implantation step is typically performed to form a pocket doped region to avoid effects such as punch-through. Ideally, the buried drain region is within the coverage of the pocket doped region. FIGS. 2A and 2B illustrate the pocket doped region and the buried drain region formed by conventional process.

In FIG. 2A, a substrate 200 is provided. A stack layer 202 and a conductive layer 204 are formed and defined on the substrate 200. Using a large angle tile ion implantation, a pocket doped region 210 is formed in the substrate 200. Since the pocket doped region 210 is formed with a large tilt angle, the profile is as shown in FIG. 2A. After the buried drain region 206 is formed in the substrate 200, as shown in FIG. 2B, the buried drain region 206 is hardly covered by the pocket doped region 210. The effect of the pocket doped region 210 is thus very limited to affect the device reliability.

SUMMARY OF THE INVENTION

The invention provides a method to scale down device dimension using a side-wall to confine buried drain implant. A substrate is provided. A first oxide layer, a nitride layer and a second oxide layer are formed on a substrate, and a conductive layer is formed on the second oxide layer. Using photolithography and etching process, the conductive layer is patterned to expose a portion of the second oxide layer. The patterned conductive layer is used as a mask layer to perform a pocket ion implantation. A pocket doped region is formed in the substrate under the exposed part of the second oxide layer.

A spacer is formed on a side-wall of the conductive layer, and the exposed part of the second oxide layer and the underlying nitride layer are removed. The formation of spacer reduces an opening defined by the patterned conductive layer. Consequently, the range to perform the drain implantation is confined. A step of ion implantation is then performed to form a buried drain region in the substrate within the pocket doped region. As the range for forming the buried drain region is reduced, so that the effective channel length is not shortened even with the diffusion of the buried drain region. This method is thus advantageous to scale down the device dimension and to obtain a higher integration.

After forming the buried drain region, a drain oxide is formed on the buried drain region as a drain oxide layer. A word line is then formed over the substrate.

The buried drain region can function as a buried bit line, while the device formed by the above method can be used to fabricate a NROM device.

In the embodiment mentioned above, the step of removing the exposed part of the second oxide layer and the underlying nitride layer can also be conducted before the spacer is formed. Thus, the spacer does not only cover the side-wall of the conductive layer, but also covers the edges of the second oxide layer and the underlying nitride layer.

In another embodiment of the invention, after the buried drain region is formed, the patterned conductive layer and the spacer on the side-wall thereof are removed. A drain oxide is then formed on the buried drain region, and a word line is formed over the substrate. Such device can be applied as a SONOS device.

Both the foregoing general description and the following detailed description are exemplary and explanatory only and are not restrictive of the invention, as claimed.

DESCRIPTION OF THE PREFERRED EMBODIMENTS

Figure 1:
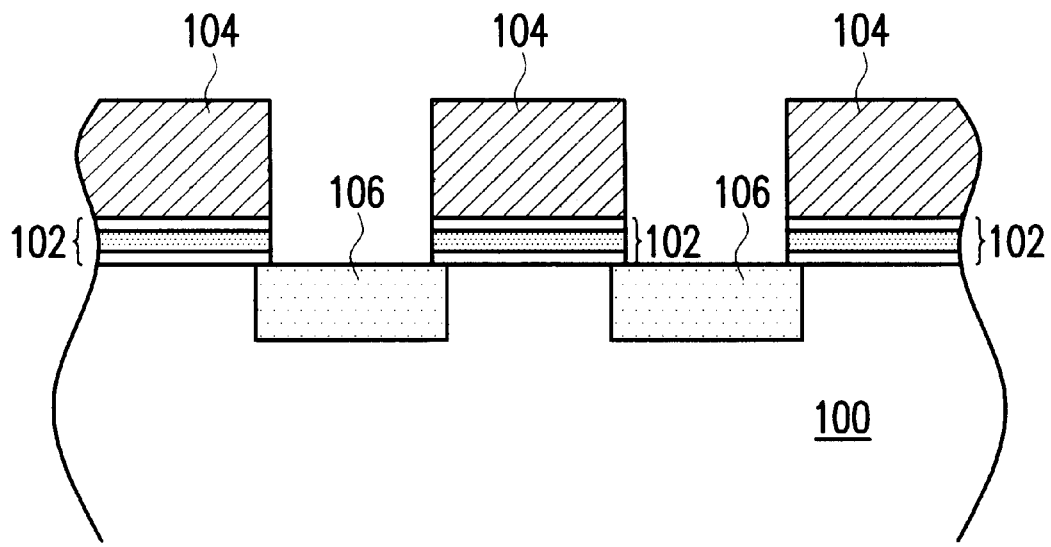
FIG. 1 shows a buried drain region formed by a conventional process.
Figure 2A:
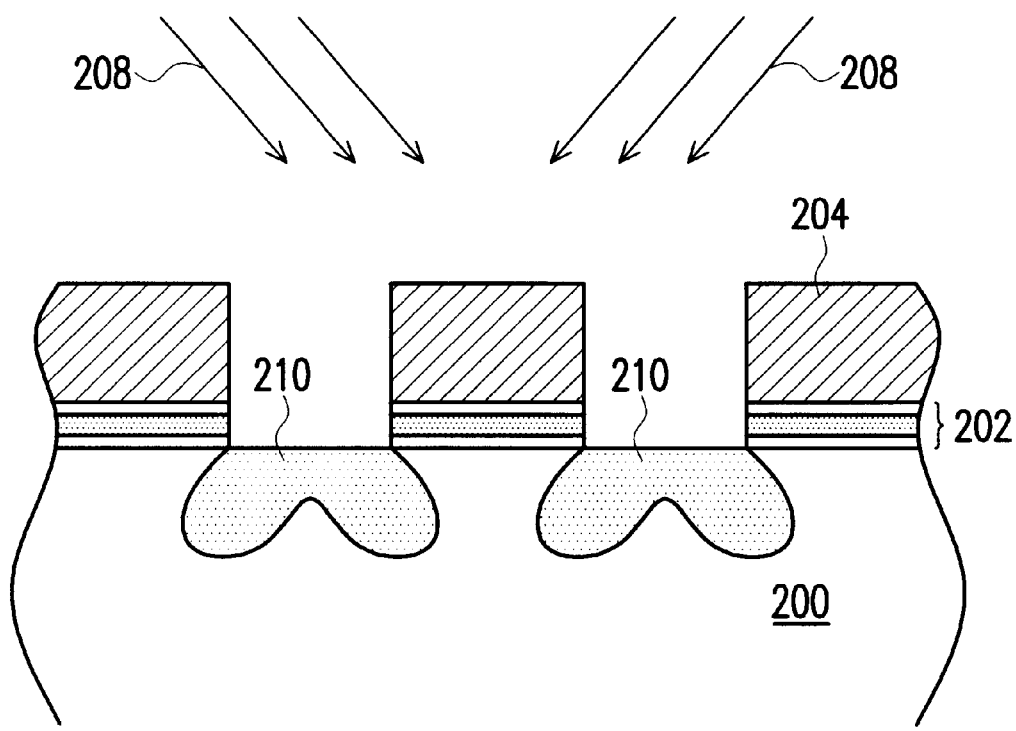
FIG. 2A shows a pocket doped region formed by a conventional process.
Figure 2B:
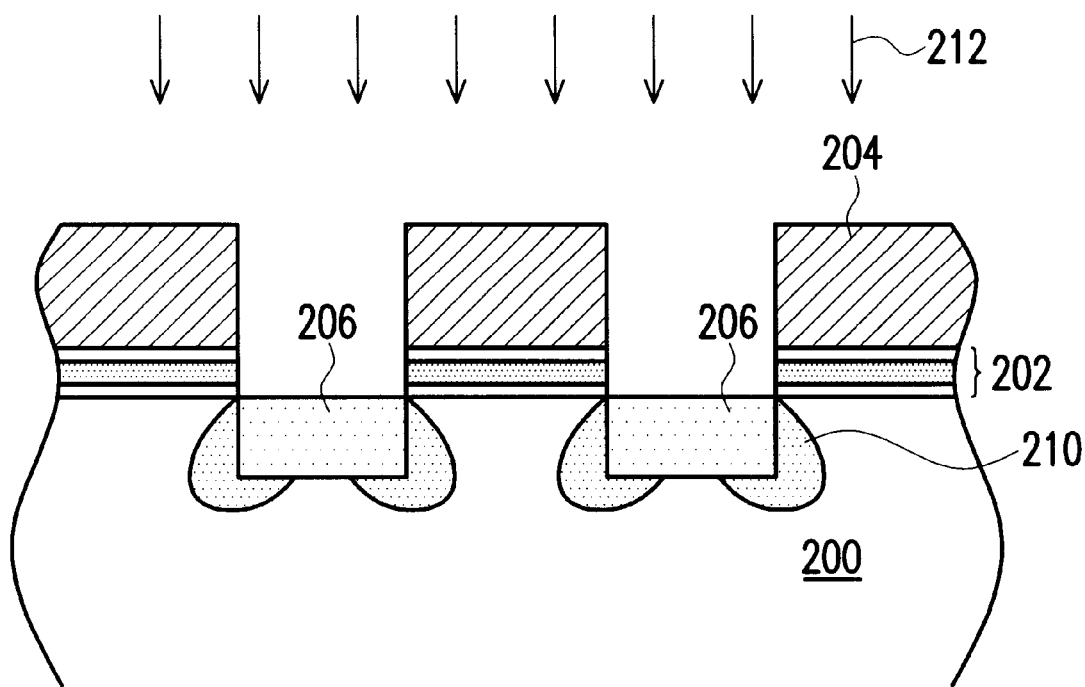
FIG. 2B shows the correlation between the buried drain region and the pocket doped region formed by the convention process.
Figure 3A:
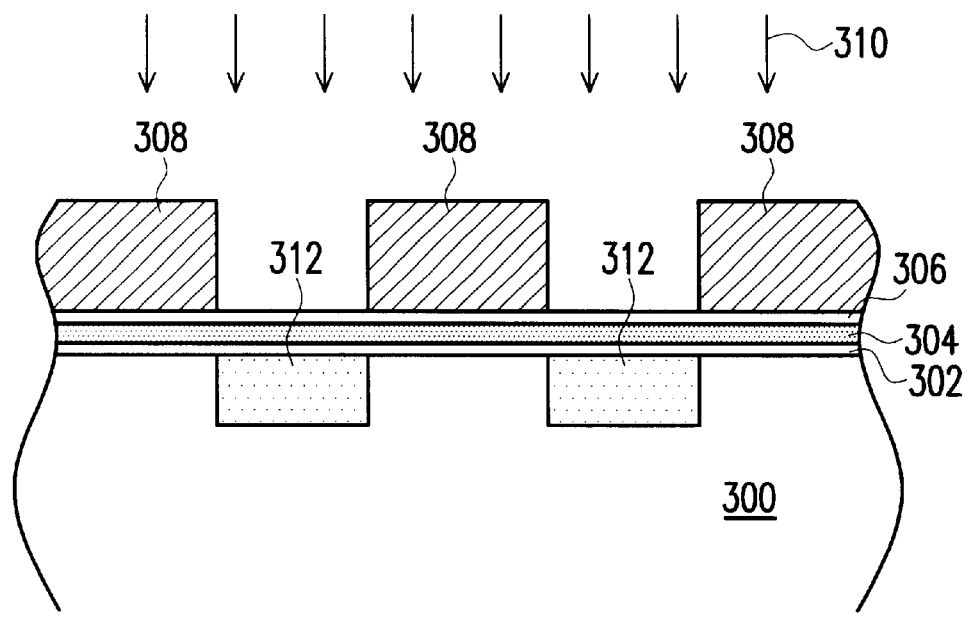
FIG. 3A to FIG. 3D shows one preferred embodiment of the invention.

FIGS. 3A to 3D show an embodiment of the invention. Referring to FIG. 3A, a substrate 300 is provided. The substrate 300 includes a P- or N-type silicon substrate, for example. An oxide layer 302, a nitride layer 304 and an oxide layer 306 are formed on the substrate 300. The oxide layer 302 functions as the gate oxide layer between the substrate 300 and the nitride layer 304, which functions as a carrier trapping layer similar to a floating gate. Due to the carrier trapping property, in many applications, the conventional polysilicon layer formed as a floating gate has been replaced with such nitride layer. A conductive layer 308 is then formed on the oxide layer 306. Preferably, the conductive layer 308 is formed of polysilicon, though other conductive material such as metal may also be applied.

Using photolithography and etching process, the conductive layer 308 is patterned to expose a part of the oxide layer 306. The patterned conductive layer 308 is then as a mask to perform a pocket ion implantation. Consequently, a pocket doped region 312 is formed in the substrate 300 between two neighboring parts of the patterned conductive layer 308.

Figure 3B:
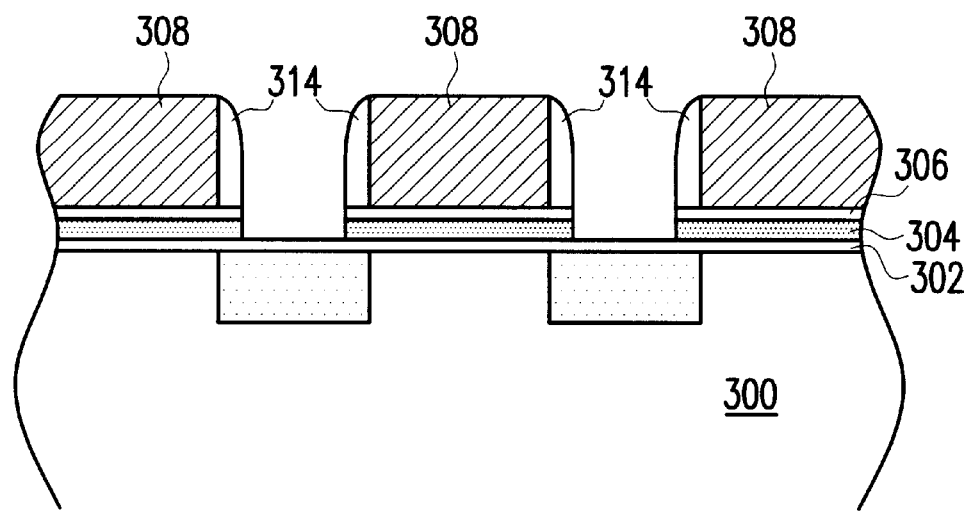

In FIG. 3B, a spacer 314 on a side-wall of the patterned conductive layer 308. The method for forming the spacer 314 includes forming a spacer material is formed over the substrate 300, followed by an etch-back process, such that a part of the spacer material is removed. The exposed oxide layer 306 and the nitride layer 304 are also removed. The step of removing the exposed oxide layer 306 and the nitride layer 304 can also be conducted before the spacer 314 is formed. Thus, the spacer 314 does not only cover the side-wall of the conductive layer 308, but also covers the edges of the oxide layer 306 and the underlying nitride layer 304.

Figure 3C:
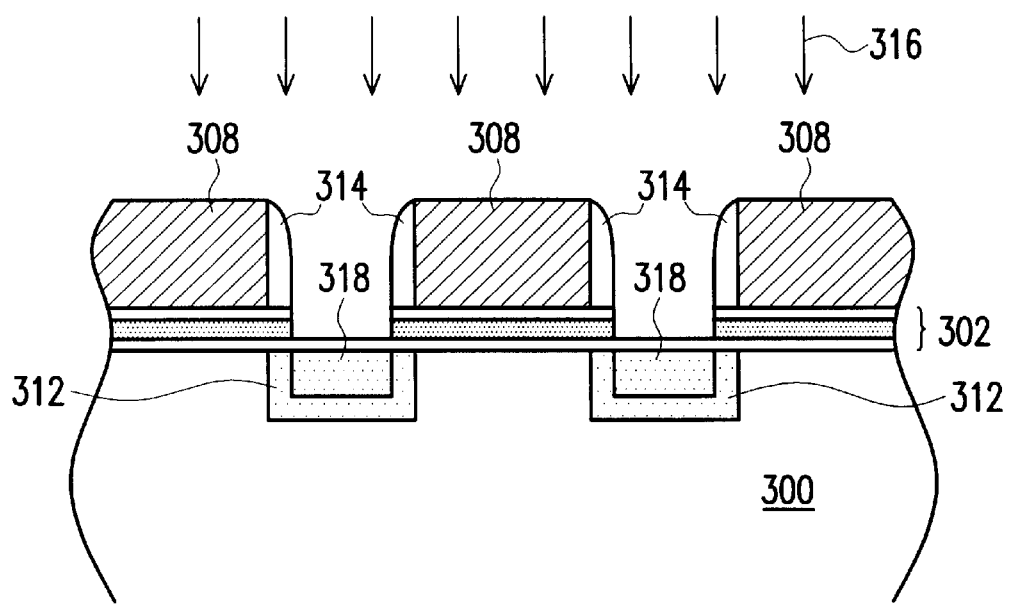

In FIG. 3C, a drain ion implantation 316 is performed to form a buried drain region 318 in the pocket doped region 312 under the exposed oxide layer 302. Meanwhile, as the spacer 314 covers an edge portion of the exposed oxide layer 302, the range for the drain implantation is confined. Consequently, the buried drain region 318 is formed with a smaller width to be covered with the pocket doped region 312. Further, even if diffusion occurs, the effective channel length next to the buried drain region 318 is not shortened. The width of the spacer 314 can be controlled to obtain various channel length according to specific requirement.

Figure 3D:
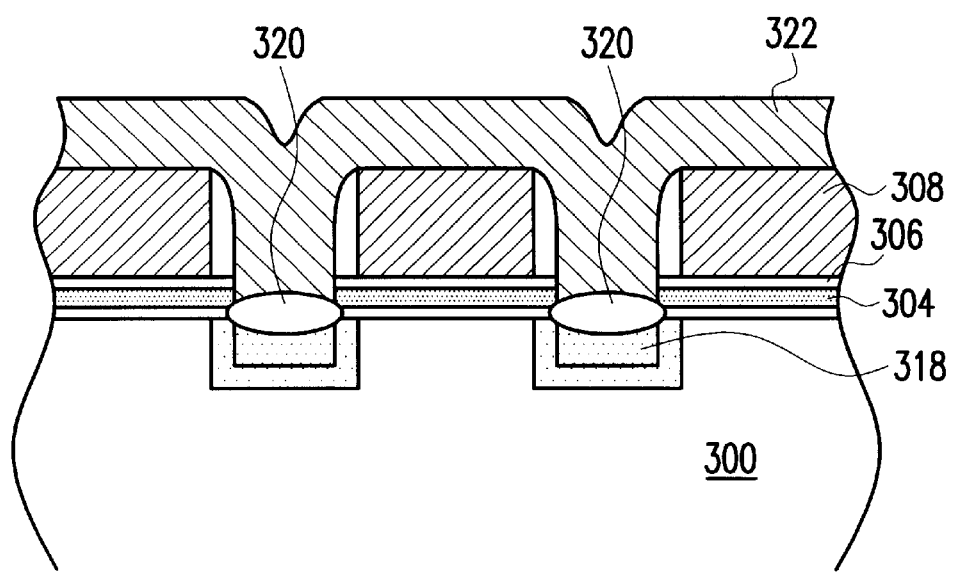

In FIG. 3D, after forming the buried drain region 318, a thermal oxidation process is performed to form a drain oxide layer 320. A conductive layer 322 is formed over the substrate 300 as a word line. The embodiment as shown in FIGS. 3A–3D can be applied to formation of a NROM device, with the buried drain region 318 functioning as a buried bit line therein.

Figure 4:
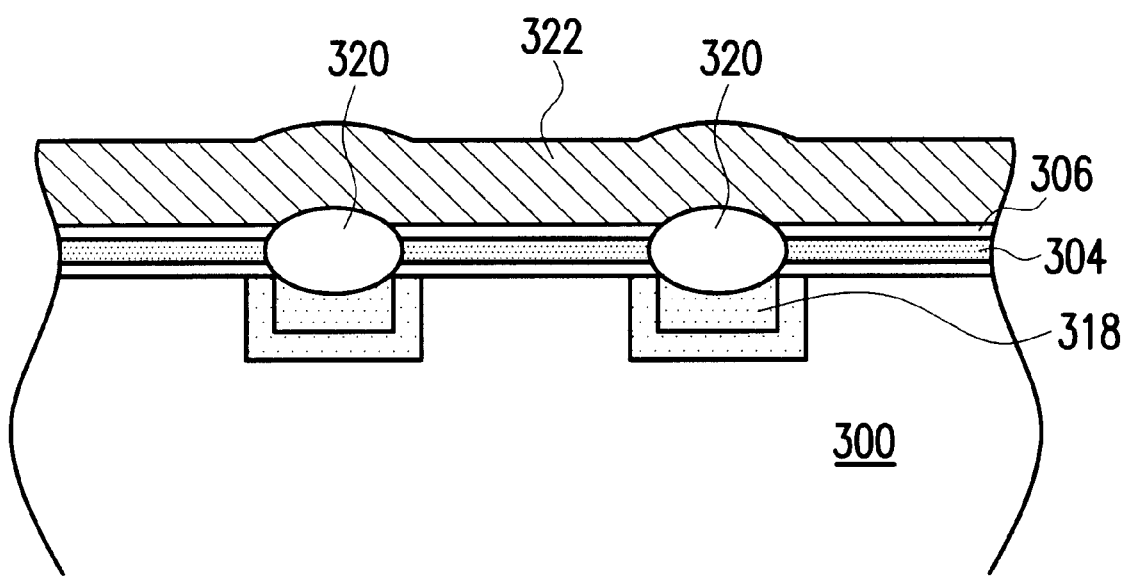
FIG. 4 shows another embodiment of the invention.

In another embodiment of the invention as shown in FIG. 4, the conductive layer 308 is removed after forming the buried drain region 318. A drain oxide layer 320 is then formed on the buried drain region 318, and a word line 322 is formed over the substrate 300. Such device can be applied as a SONOS device with the buried drain region 318 as the buried bit line.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A method to scale down device dimension by confining drain implant, comprising:
    forming a first oxide layer, a trapping layer, a second oxide layer, and a conductive layer on a substrate;
    patterning the conductive layer to expose a part of the second oxide layer;
    using the patterned conductive layer as a mask to form a pocket doped region in the substrate under the exposed second oxide layer;
    forming a spacer on a side-wall of the patterned conductive layer and removing the exposed second oxide layer and the underlying trapping layer; and
    forming a buried drain region in the substrate with the spacer and the patterned conductive layer as a mask.

2. The method according to claim 1, further comprising a step of forming a drain oxide layer on the buried drain region.

3. The method according to claim 2, wherein the step of forming the drain oxide layer comprises thermal oxidation.

4. The method according to claim 1, further comprising a step of forming a word line over the substrate to form a NROM device.

5. The method according to claim 1, wherein the step of forming the trapping layer comprising forming a nitride layer.

6. The method according to claim 1, wherein the step of forming the conductive layer comprises forming a polysilicon layer.

7. The method according to claim 1, wherein the step of forming the spacer further comprising:
    forming a spacer material over the substrate; and
    etching back the spacer material to form the spacer.

8. The method according to claim 7, wherein the step of forming the spacer material comprising forming a dielectric material.

9. A method of fabricating a SONOS device, comprising:
    forming a first oxide layer, a nitride layer and a second oxide layer on a substrate;
    forming a conductive pattern on the second oxide layer;
    performing a pocket ion implantation using the conductive pattern as a mask to form a pocket doped region in the substrate;
    forming a spacer on a side-wall of the conductive pattern and removing the exposed second oxide layer and the underlying trapping layer;
    using the spacer and the conductive pattern as a mask to perform a drain ion implantation step to form a buried bit line in the substrate;
    removing the conductive pattern;
    forming a bit line oxide layer on the buried bit line; and
    forming a word line over the substrate.

10. The method according to claim 9, wherein the step of forming the conductive layer comprises forming a polysilicon layer.

11. The method according to claim 9, wherein the step of forming the spacer further comprising:
    to forming a spacer material over the substrate; and
    etching back the spacer material to form the spacer.

12. The method according to claim 11, wherein the step of forming the spacer material comprising forming a dielectric material.

13. A method to scale down device dimension by confining drain implant, comprising:
    forming a first oxide layer, a trapping layer, a second oxide layer, and a conductive layer on a substrate;
    patterning the conductive layer to expose a part of the second oxide layer;
    using the patterned conductive layer as a mask to form a pocket doped region in the substrate under the exposed second oxide layer;
    using the patterned conductive layer as a mask to remove the exposed second oxide layer and the underlying trapping layer
    forming a spacer on a side-wall of the patterned conductive layer; and
    forming a buried drain region in the substrate with the spacer and the patterned conductive layer as a mask.

14. The method according to claim 13, further comprising a step of forming a drain oxide layer on the buried drain region.

15. The method according to claim 14, wherein the step of forming the drain oxide layer comprises thermal oxidation.

16. The method according to claim 14, fuirther comprising a step of forming a word line over the substrate to form a NROM device.

17. The method according to claim 13, wherein the step of forming the trapping layer comprising forming a nitride layer.

18. The method according to claim 13, wherein the step of forming the conductive layer comprises forming a polysilicon layer.

19. The method according to claim 13, wherein the step of forming the spacer further comprising:

forming a spacer material over the substrate; and etching back the spacer material to form the spacer.

20. The method according to claim 19, wherein the step of forming the spacer material comprising forming a dielectric material.

* * * * *